US010340661B2

(12) United States Patent
Caër et al.

(10) Patent No.: US 10,340,661 B2
(45) Date of Patent: Jul. 2, 2019

(54) ELECTRO-OPTICAL DEVICE WITH LATERAL CURRENT INJECTION REGIONS

(71) Applicant: International Business Machines Corporation, Armonk, NY (US)

(72) Inventors: Charles Caër, Adliswil (CH); Lukas Czornomaz, Zurich (CH); Stefan Abel, Zurich (CH); Bert Jan Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 15/800,339

(22) Filed: Nov. 1, 2017

(65) Prior Publication Data
US 2019/0131772 A1     May 2, 2019

(51) Int. Cl.
*H01S 5/10* (2006.01)
*H01S 5/20* (2006.01)
(Continued)

(52) U.S. Cl.
CPC .......... *H01S 5/2031* (2013.01); *H01S 5/026* (2013.01); *H01S 5/0424* (2013.01);
(Continued)

(58) Field of Classification Search
CPC .... H01S 5/1028; H01S 5/1014; H01S 5/0424; H01S 5/1032; H01S 5/16–168
See application file for complete search history.

(56) References Cited

U.S. PATENT DOCUMENTS

| 5,606,176 A * | 2/1997 | Nitta | B82Y 20/00 |
| | | | 257/18 |
| 8,787,417 B2 | 7/2014 | Baets et al. | |

(Continued)

FOREIGN PATENT DOCUMENTS

| EP | 2544319 A1 * | 1/2013 | ........... H01S 5/1032 |
| EP | 3051638 A1 * | 8/2016 | ........... H01S 5/1014 |

(Continued)

OTHER PUBLICATIONS

Yoshimoto et al., "Polarisation-insensitive semiconductor optical amplifier gate switch with butt-jointed spot size converters—its uniformity", Feb. 1999, IEE Proc.-Optoelectron., vol. 146, No. 1, pp. 71-76 (Year: 1999).*

(Continued)

*Primary Examiner* — Joshua King
(74) *Attorney, Agent, or Firm* — Jared L. Montanaro

(57) ABSTRACT

Embodiments of the disclosure are directed to a lateral current injection electro-optical device. The device comprises an active region with a stack of III-V semiconductor gain materials stacked along a stacking direction z. The active region may be formed as a slab having several lateral surface portions, each extending parallel to the stacking direction z. The device further comprises two paired elements, which include: a pair of doped layers of III-V semiconductor materials (an n-doped layer and a p-doped layer); and a pair of lateral waveguide cores. The two paired elements may be laterally arranged, two-by-two, on opposite sides of the slab. The elements distinctly adjoin respective ones of the lateral surface portions of the slab, so as for these elements to be separated from each other by the slab. The disclosure may be further directed to related silicon photonics devices and fabrication methods.

13 Claims, 6 Drawing Sheets

(51) Int. Cl.

| | |
|---|---|
| *H01S 5/30* | (2006.01) |
| *H01S 5/026* | (2006.01) |
| *H01S 5/042* | (2006.01) |
| *H01S 5/125* | (2006.01) |
| *H01S 5/227* | (2006.01) |
| *H01S 5/343* | (2006.01) |

(52) U.S. Cl.
CPC .......... *H01S 5/1014* (2013.01); *H01S 5/1028* (2013.01); *H01S 5/125* (2013.01); *H01S 5/227* (2013.01); *H01S 5/3054* (2013.01); *H01S 5/343* (2013.01); *H01S 5/0425* (2013.01)

(56) References Cited

U.S. PATENT DOCUMENTS

| | | | |
|---|---|---|---|
| 8,829,638 B2 | 9/2014 | Shambat et al. | |
| 9,413,139 B2 | 8/2016 | Thourhout et al. | |
| 9,419,412 B2 | 8/2016 | Krishnamurthy et al. | |
| 9,431,791 B1* | 8/2016 | Norberg | H04J 14/02 |
| 2003/0007719 A1* | 1/2003 | Forrest | B82Y 20/00 385/14 |
| 2005/0084991 A1* | 4/2005 | Lee | H01S 5/227 438/21 |
| 2007/0152234 A1* | 7/2007 | Yamamoto | B82Y 20/00 257/103 |
| 2008/0112451 A1 | 5/2008 | Rossin et al. | |
| 2008/0198888 A1* | 8/2008 | Arimoto | H01S 5/0424 372/45.011 |
| 2011/0227116 A1* | 9/2011 | Saito | H01L 31/103 257/98 |
| 2012/0288228 A1* | 11/2012 | Saito | G02B 6/122 385/14 |
| 2013/0259077 A1* | 10/2013 | Ben Bakir | G02B 6/12004 372/44.01 |
| 2013/0301985 A1* | 11/2013 | Achouche | G02B 6/12002 385/30 |
| 2014/0153600 A1* | 6/2014 | Luo | B82Y 20/00 372/40 |
| 2014/0175490 A1* | 6/2014 | Suwa | H01L 33/0054 257/98 |
| 2015/0132002 A1* | 5/2015 | Krishnamurthy | H01S 5/06255 398/79 |
| 2015/0144871 A1* | 5/2015 | Miller | H01L 33/06 257/13 |
| 2016/0252692 A1* | 9/2016 | Hofrichter | H01S 5/0014 250/227.11 |

FOREIGN PATENT DOCUMENTS

| | | |
|---|---|---|
| JP | 2001094209 A | 4/2001 |
| JP | 2013165152 A | 8/2013 |

OTHER PUBLICATIONS

Pu et al., "A novel type of ultra-compact lateral-current-injection iii/v photonic device integrated on SOI for electronic-Photonic chip application," Proc. SPIE 8629, Silicon Photonics VIII, 862913 (Mar. 14, 2013); doi:10.1117/12.2001475, http://proceedings.spiedigitallibrary.org/proceeding.aspx?articleid=1668718, Abstract Only.

Okumura et al., "Lateral current injection GaInAsP/InP laser on semi-insulating substrate for membrane-based photonic circuits," Optics Express 17(15):12564-70, https://www.researchgate.net/publication/26716869_Lateral_current_injection_GaInAsPInP_laser_on_semi-insulating_substrate_for_membrane-based_photonic_circuits, Aug. 2009.

Kakitsuka et al., "Lateral current-injection membrane lasers fabricated on a silicon substrate," NTT Technical Review, vol. 14, No. 1, pp. 1-7, Jan. 2016, Abstract Only.

Nishiyama et al., "III-V/SOI heterogeneous photonic integrated devices for optical interconnection in LSI," Conference Proceedings—International Conference on Indium Phosphide and Related Materials • Jun. 2009, https://www.researchgate.net/publication/224484430_III-VSOI_heterogeneous_photonic_integrated_devices_for_optical_interconnection_in_LSI, Abstract Only, printed Aug. 22, 2017, 3 pgs.

Takeda et al., "Few-fJ/bit data transmissions using directly modulated lambda-scale embedded active region Photonic-crystal lasers," Nature Photonics 7, 569 (2013), pp. 569-575, © 2013 Macmillan Publishers Limited.

Takeda et al., "Heterogeneously integrated photonic-crystal lasers on silicon for on/off chip optical interconnects," Optics Express 22 (26), 702 (2014), 7 pgs., © 2015 Optical Society of America.

Inoue et al., "Room-temperature continuous-wave operation of GaInAsP/InP lateral-current injection membrane laser bonded on Si substrate," Applied Physics Express 7, 072701 (2014), 5 pgs., © 2014 The Japan Society of Applied Physics.

Inoue et al., "Sub-milliampere threshold operation of butt jointed built-in membrane DFB laser bonded on Si substrate," Optics Express 23 (6), 7771 (2015), 8 pgs., © 2015 OSA.

Miatsuo et al., "Directly modulated buried heterostructure DFB laser on SiO2/Si substrate fabricated by regrowth of InP using bonded active layer," Optics Express 22 (10), 12139 (2014), 9 pgs., © 2014 OSA.

Written Opinion of the International Searching Authority, International Application No. PCT/IB2018/058246, Jan. 2, 2019, 7 pgs.

\* cited by examiner

ELECTRO-OPTICAL DEVICE WITH LATERAL CURRENT INJECTION REGIONS

BACKGROUND

The present disclosure relates generally to the field of lateral current injection electro-optical devices, and more specifically to silicon photonic chips comprising such devices. Electro-optical devices may notably comprise edge-emitting laser devices, optical detectors and semiconductor optical amplifiers.

SUMMARY

Embodiments of the present disclosure include as a lateral current injection electro-optical device, a silicon photonic chip, and a method for fabricating the electro-optical device. The device comprises an active region, with a stack of III-V semiconductor gain materials stacked along a stacking direction z. The active region may be formed as a slab (e.g., piece, block, etc.) having several lateral surface portions, each extending parallel to the stacking direction z. The device further comprises two paired elements, which include: a pair of doped layers of III-V semiconductor materials (i.e., an n-doped layer and a p-doped layer); and a pair of lateral waveguide cores. The two paired elements may be laterally arranged, two-by-two, on opposite sides of the slab. The elements distinctly adjoin respective lateral surface portions of the slab, separating these elements from each other by the slab.

The above summary is not intended to describe each illustrated embodiment or every implementation of the present disclosure. Devices and methods of fabrication embodying the present disclosure will now be described, by way of non-limiting examples, and in reference to the accompanying drawings.

Figure 1:
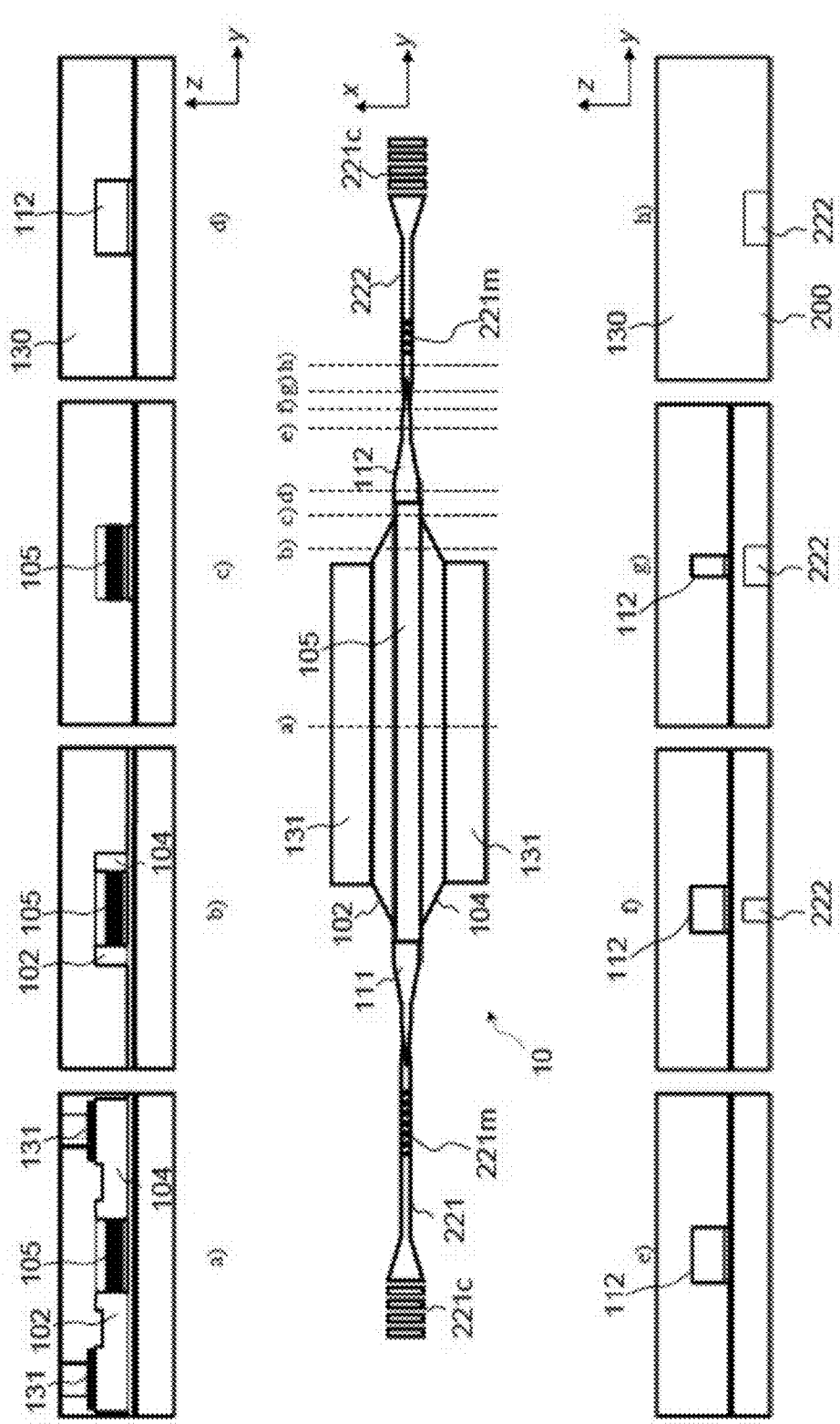
FIG. 1 depicts a top view of a lateral current injection electro-optical device, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of lateral current injection electro-optical devices, and more specifically to silicon photonic chips comprising such devices. While the present disclosure is not necessarily limited to such applications, various aspects of the disclosure may be appreciated through a discussion of various examples using this context.

According to embodiments, waveguide cores may be provided on the same level as a p-doped layer and a n-doped layer of a lateral current electro-optical device. This may allow the thickness of the device to be reduced, all things otherwise equal. This, in turn, may make it easier to integrate the present devices, e.g., in silicon photonic chips. In addition, because the waveguide cores may be provided on the same level as the p-doped layer and the n-doped layer, a more efficient optical coupling can, in principle, be obtained.

In embodiments, the electro-optical device may include one or more of the following (optional) features:

The slab may have two pairs of opposite, lateral surface portions, each extending parallel to said stacking direction z, the p-doped layer and the n-doped layer may be arranged on respective sides of the slab, contiguously with the opposite, lateral surface portions of one of said two pairs of surface portions, and the lateral waveguide cores may be laterally butt-jointed to the opposite, lateral surface portions of the other one of said two pairs of surface portions;

The slab may have a form factor, whereby a length of the slab may be larger than a width thereof. Said width, said length, and said stacking direction z may be perpendicular. A maximum length of each of the p-doped layer and the n-doped layer may be less than a length of said opposite, lateral surface portions of said one of said two pairs. This lowers the risk of electrical shorts between the doped layers via any of the waveguide cores;

Each of the p-doped layer and the n-doped layer may comprise, on a top surface portion thereof, a recess extending laterally along the slab and parallel to its length, so as for the active region and the contiguous pair of doped layers to have a rib waveguide configuration;

The electro-optical device may further comprise a metal contact patterned on a top surface portion of each of the p-doped layer and the n-doped layer, along the recess;

The electro-optical device may further comprise structured silicon waveguide cores having portions extending underneath said lateral waveguide cores. The electro-optical device may be further configured as a hybrid lateral current injection device, whereby optical radiation out-coupled from the active region via the lateral waveguide cores couples into the structured silicon waveguide cores, in operation;

The lateral waveguide cores may be tapered, so as to thin down outwardly, and said portions of the structured silicon waveguide cores may be reversely tapered;

The lateral waveguide cores exhibit, each, a three-stage taper;

Each of the p-doped layer and the n-doped layer may be tapered, so as to laterally flare towards the slab, at a level of contact therewith;

The electro-optical device may be a lateral current injection laser device;

The laser device may be configured as a single mode laser device;

The silicon waveguides may comprise Bragg mirrors configured so as to provide a radiation feedback for the laser;

Said stack of III-V semiconductor gain materials may comprise one of: $In_{1-x-y}Al_xGa_yAs$; $In_{1-x}Ga_xAs_yP_{1-y}$; and $In_{1-x}Ga_xAs_yN_{1-y}$, with $0 \leq x \leq 1$ and $0 \leq y \leq 1-x$; and each of the p-doped layer and the n-doped layer may comprise one of InP, InAs or GaAs; and Each of the lateral waveguide cores, the p-doped layer and the n-doped layer may be a selectively regrown layer.

According to another aspect, the disclosure is embodied as a silicon photonic chip. The chip may comprise a lateral current injection, electro-optical device such as described above. The chip may further comprise structured silicon waveguide cores having portions extending underneath the lateral waveguide cores of this electro-optical device.

The electro-optical device may be preferably configured in the chip as a hybrid lateral current injection device, whereby optical radiation out-coupled from the active region via the lateral waveguide cores couples into the structured silicon waveguide cores, in operation.

In preferred embodiments, the chip further comprises a silicon on insulator wafer, whose top silicon layer may be structured so as to form said structured silicon waveguide cores.

Preferably, the silicon photonic chip may be a CMOS-fabricated device.

In embodiments, each of the p-doped layer and the n-doped layer may comprise a recess extending laterally along the slab and parallel to its length, so as for the active region and the contiguous pair of doped layers to have a rib waveguide configuration. The active region may play the role of a waveguide core of a corresponding rib waveguide.

Preferably, the silicon photonic chip may further comprise a CMOS-compatible metal contact patterned on a top surface portion of each of the p-doped layer and the n-doped layer, the top surface portion being on a same side as and along the recess extending on said each of the doped layer.

In preferred embodiments, the electro-optical device may be embedded in a back end of the line of the silicon photonic chip.

Preferably, the electro-optical device may be co-integrated, in the back end of the line of the silicon photonic chip, with one or more CMOS-fabricated integrated circuits.

In embodiments, the CMOS-fabricated integrated circuits may comprise transistors configured for driving said electro-optical device.

According to another aspect, the disclosure is embodied as a method of fabrication of an electro-optical device. The method may comprise forming an active region of the electro-optical device, which region may comprise a stack of III-V semiconductor gain materials stacked along a stacking direction z. The active region may be further formed as a slab having several lateral surface portions, each extending parallel to said stacking direction z. In addition, the method may comprise selectively re-growing two paired elements. These two pairs may include: a pair of doped layers of III-V semiconductor materials, comprising an n-doped layer and a p-doped layer; and a pair of lateral waveguide cores. These two paired elements may be selectively regrown so as for the two pairs to be laterally arranged, two-by-two, on opposite sides of the slab. As a result, said elements may distinctly adjoin respective ones of the lateral surface portions of the slab, so as for the elements to be separated from each other by the slab.

The following embodiments may be described in the structure that follows. First, general embodiments and high-level variants may be described (sect. 1). The next section addresses more specific embodiments and technical implementation details (sect. 2).

1. General Embodiments and High-Level Variants

The accompanying drawings show simplified representations of devices or parts thereof, as involved in embodiments. Note that the photonics chips of FIGS. 3-7 may be electro-optical elements. Conversely, the present electro-optical elements can be regarded as parts or components of a silicon photonics chip or another type of integrated circuit chip. Technical features depicted in the drawings may be not necessarily to scale. Similar or functionally similar elements in the figures have been allocated the same numeral references, unless otherwise indicated.

In reference to FIGS. 1-6, an aspect of the disclosure may be first described, which concerns a lateral current injection (LCI), electro-optical device 10, hereafter referred to as an LCI device 10, for simplicity.

The LCI device 10 comprises an active region 105. This region 105 may comprise a stack of III-V semiconductor gain materials (sometimes referred to as "the stack"), e.g., materials from the group of III-V compound semiconductors that provide the gain medium, so as to achieve optical amplification of radiations of interest. As assumed in the accompanying drawings, the III-V materials of the stack may be stacked along a stacking direction z that may be perpendicular to a main plane of the stack (e.g., the average plane of the stack, parallel to plane (x, y)).

Figure 2A:
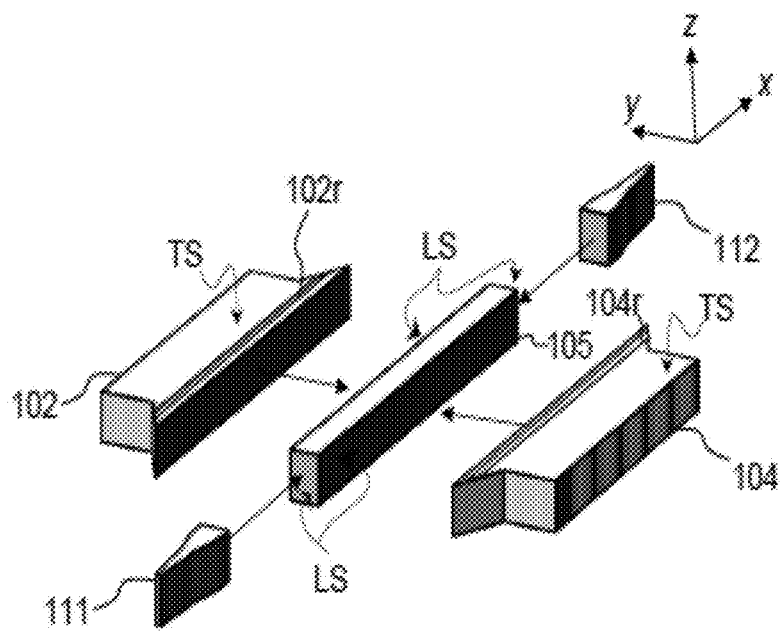
FIGS. 2A and 2B depict 3D views of selected components of the device of FIG. 1, in accordance with embodiments of the present disclosure.

The active region 105 may be formed as a slab that may have several lateral surface portions LS, as seen in FIG. 2A. Being "lateral" surfaces, each of the lateral surface portions LS of the active region 105 ideally extends in a plane parallel to the stacking direction z. Of course, in practice, the lateral surface portions LS will neither be perfectly plane nor perfectly parallel to the stacking direction. Still, one understands that the lateral surface portions LS will typically be transverse to basis planes (e.g., parallel to (x, y)) of the active region 105. Fabrication methods as proposed herein allow clean separations between the various elements 102, 104, 105, 111, and 112 to be obtained.

The LCI device 10 may further comprise two pairs of elements 102, 104; 111, 112 on opposite sides of the slab (e.g., the active region 105). Such elements may include a pair of doped layers of III-V semiconductor materials, also referred to as "contact layers", which may include an n-doped layer of the element 102 and a p-doped layer of the element 104. The two paired elements 102, 104; 111, 112 may further comprise a pair of lateral waveguide cores elements 111 and 112, meant for coupling radiation to and/or from the active region 105.

Figure 2B:
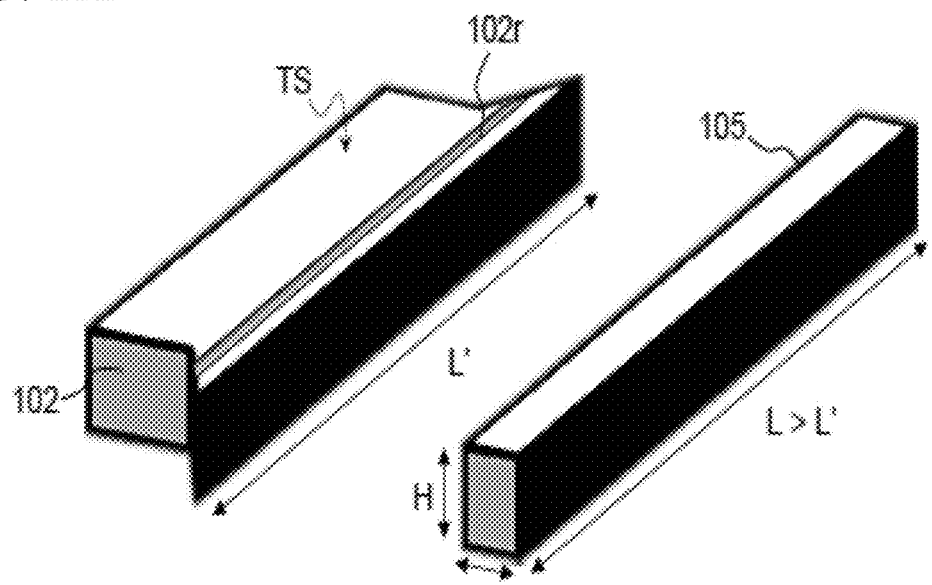

As seen in FIGS. 1, 2A, and 2B, the two paired elements 102, 104; 111, 112 may be laterally arranged, two-by-two, on opposite sides of the slab. These elements may distinctly adjoin respective lateral surface portions LS of the slab. That is, an interstitial surface portion may be provided between any two laterally contiguous ones of the elements, at the level of contact with the slab, so as for the elements 102, 104; 111, 112 to be separated (and thus insulated from each other) by the slab, at a level of contact with lateral surface portions thereof. Accordingly, there may be no short or no leakage path between any two contiguous pair of these elements.

According to the above design, the waveguide cores may be provided on the same level as the p-doped layer of the element 104 and the n-doped layer of the element 102. This may allow the thickness of the device to be reduced, all things being otherwise equal. This, in turn, may make it easier to integrate the present devices in larger devices, e.g., in the back end of the line (BEOL) or the front end of the line (FEOL) of a Si photonics chip. In addition, because the waveguide cores may be provided on the same level as the p-doped layer of the element 104 and the n-doped layer of the element 102, a more efficient optical coupling (in particular an out-coupling) can, in principle, be obtained.

Although unconventional, the above configuration can be obtained thanks to suitably adapted fabrication methods. For example, the active region 105, the n-doped region 102, and the p-doped region 104 can be self-aligned by using techniques of selective regrowth. Selectively regrowing the n-doped and p-doped regions 102, 104 around the active region 105 may make it possible for the n-doped and p-doped regions 102, 104 to be separated by the active region 105 and, e.g., extend on each side of the lateral waveguides cores (e.g., on each side of the main direction of extension of the lateral waveguide cores).

Lateral current injection can be achieved via suitably arranged metal contacts, through-vias, and/or conducting traces contacting the n-doped and p-doped regions. A LCI-based III-V device as proposed herein may allow small threshold currents and footprint, which can further be easily embedded in the back-end of the line of a CMOS-fabricated chip. This, in turn, may enable a co-integration with other CMOS components, as discussed later in detail.

Referring now more specifically to FIGS. 1, 2A, and 2B, the active region 105, as the slab may, in embodiments, have a polygonal section (e.g., horizontally, parallel to the (x, y) plane). In particular, the slab may exhibit two pairs of opposite, lateral surface portions LS, each extending parallel to the stacking direction z. The simplest shape the slab may have may be perhaps a parallelepiped (e.g., a rectangular cuboid), in which case the slab may comprise only two pairs of opposite, lateral surface portions LS, as assumed in FIGS. 1, 2A, and 2B.

In all cases, assuming the slab may have a polygonal (horizontal) section, the two pairs of opposite, lateral surface portions LS need be oppositely arranged, two-by-two. Two-by-two being Two opposite lateral surfaces LS may be perpendicular to the main direction of extension (e.g., parallel to the length L, parallel to axis y) of the slab and parallel to the width W (parallel to axis x). The other two opposite surfaces of the slab may be parallel to the length L and perpendicular to the width W of the slab. Now, the slab need not be a perfect rectangular cuboid. Although it would typically be a shallow, rectangular prism, it may indeed be given a more sophisticated shape.

Assuming the slab is a rectangular cuboid, it exhibits two pairs of lateral surface portions, i.e., four lateral surface portions, which may be opposite two-by-two, as illustrated in FIGS. 2A-2B. The p-doped layer (e.g., contact layer) element 104 and the n-doped layer (e.g., contact layer) element 102 may be arranged on opposite sides of the slab, contiguously with opposite surface portions LS of one of the two pairs. Meanwhile, the lateral waveguide cores elements 111 and 112 may be laterally butt-jointed to the other two lateral surface portions, i.e., contiguously with the surface portions LS of the other pair. Note that, in FIGS. 2A-2B, the lateral waveguide cores extend parallel to the longitudinal direction of the slab. More generally though, at least a portion of the lateral waveguides cores elements 111 and 112 could extend along the longitudinal direction, so as for the four elements 102, 104; 111, 112 to be at least partly arranged along the directions defined about the slab. In all cases, the two paired elements 102, 104; 111, 112 may be laterally and oppositely arranged, two-by-two, on opposite sides of the slab. This way, lateral waveguide cores may be on the same level as the active region 105 and the contact layers elements 102 and 104.

Referring now specifically to FIGS. 2A-2B: the slab preferably may have a form factor. That is, the length L of the slab may be preferably larger than its width W, it being noted that the width W (parallel to axis x), the length L (parallel to axis y) and the stacking direction z may be perpendicular two-by-two. Now, each of the n-doped layer element 102 and the p-doped layer element 104 may be structured so as for their maximal length L' to be less than the length L of the opposite, lateral surface portions LS they contact, at the level of contact with the slab (the lengths L, L' may be measured along the main direction of extension of the slab). This may lower the risk of electrical shorts between the doped layers elements 102 and 104, via any of the waveguide cores elements 111 and 112 at the other two edges. It may be understood that the contact layers elements 102 and 104 can, each, be aligned with the slab, so as for an average axis (along x) of the contact layers elements 102 and 104 to be aligned with an average axis of the slab (along that same axis x). The lateral waveguide cores elements 111 and 112 can accordingly, more safely, be provided on the other two surface portions (at the same level as the doped layers elements 102 and 104), especially as the width W is typically smaller than the length L of the slab.

The width W of the slab should preferably be between 200 nm and 5 µm. The height (or thickness) H of the slab should preferably be between 50 nm and 500 nm, as larger thicknesses may make it more difficult to integrate the slab in the BEOL of a CMOS chip. The length of the slab should typically range from 10 µm to several mm, depending on the application.

Incidentally, as seen in FIGS. 1, 2A, and 2B, each of the doped layers elements 102 and 104 may be tapered (i.e., flared), so as to laterally flare towards the slab in the plane (x, y), at a level of contact therewith. This may allow for a maximization of the contact between the doped layers elements 102 and 104 and the active region 105. All the more, this may ensure a better transition between the central region (corresponding to cutting plane a)) in FIG. 1 and the regions corresponding to planes c) and d) in FIG. 1. In embodiments, this may further help in refining the profile of the horizontal cross-section of the device, in order to achieve adiabatic transitions. Still, since the maximal length L' of the doped layers may be less than the length L of the corresponding supporting surface portion LS of the slab; electrical shorts can be avoided.

Figure 3:
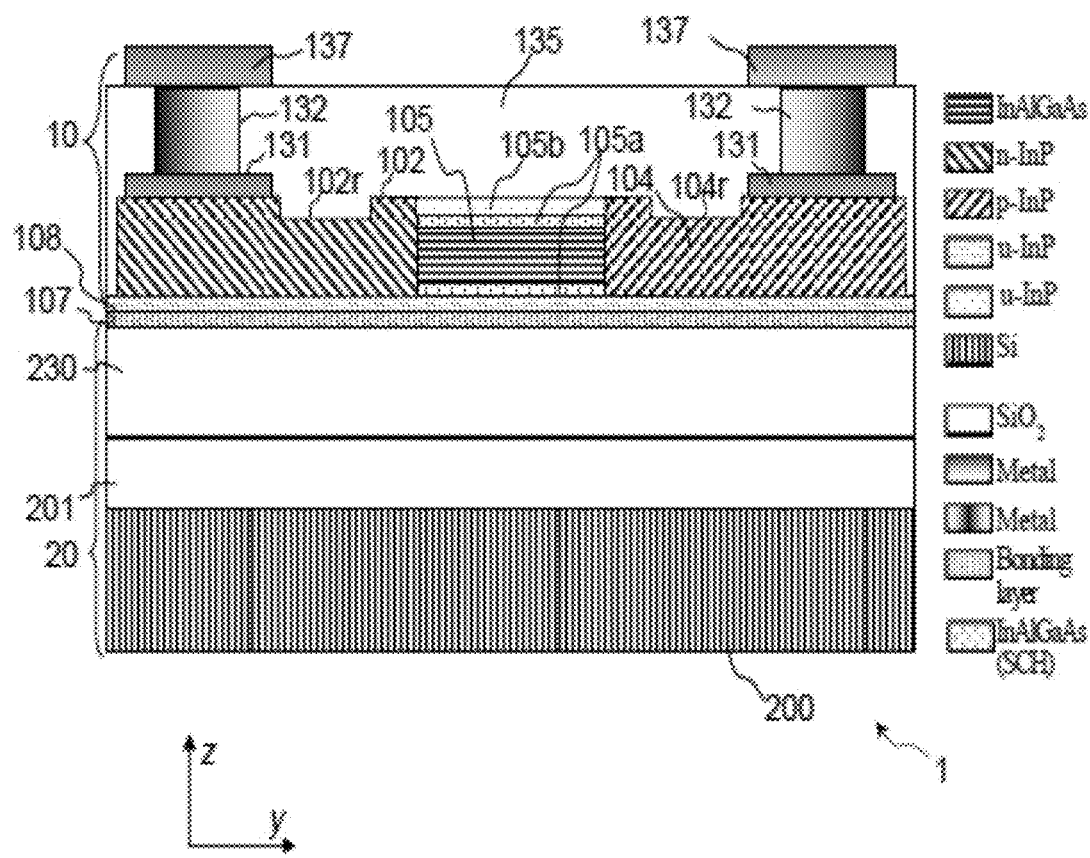
FIG. 3 depicts a 2D cross-sectional view (partial) of a silicon photonics chip comprising a lateral current injection laser device, in accordance with embodiments of the present disclosure.

In embodiments as depicted in FIGS. 2A, 2B, and 3, each of the n-doped layer element 102 and the p-doped layer element 104 may comprise a recess 102r and 104r extending on a top surface portion TS thereof. Such recesses 102r and 104r may laterally extend along the slab and parallel to its length L. The recesses 102r and 104r can be obtained by an etching process. In embodiments, this may give the active region 105 and the contiguous pair of doped layers elements 102 and 104 a rib waveguide configuration, which, in turn, may enable closer metal contacts. The rib waveguide configuration may allow closer metal contacts because the mode can be made more confined in a rib waveguide thanks to the index contrast between the recessed part and the core.

Thus, an evanescent tail of the mode that "sees" the metal contacts may be reduced. The active region 105 may play the role of a waveguide core of the corresponding rib waveguide. Such a configuration allows better optical confinement in the active region 105, which, in turn, may result in enhancing the device efficiency. For example, when embodied as a hybrid laser, the present electro-optical devices may allow a strong mode overlap with the active region 105, as well as a satisfactory confinement, thanks to the rib waveguide configuration obtained with the recesses 102r, 104r.

In that respect, and as seen in FIG. 3, a Si photonic chip 1 which may comprise the LCI device 10, may additionally comprise metal contacts 131, patterned on the top surface portion TS of the n-doped layer element 102 and the p-doped layer element 104, along the recesses 102r and 104r. The metal contacts 131 may form ohmic contacts, i.e., metal-semiconductor contacts. As seen in FIG. 3, they may be joined by vertical metal vias 132 and top metal pads 137 (that can also act as interconnect wirings) which may be provided for lateral current injection in the stack. The vertical metal vias 132 may be separated by an $SiO_2$ substrate 135. The ohmic contacts may comprise p- and n-type contacts, respectively, in contact with the n-doped layer element 102 and the p-doped layer element 104.

The slab, the surrounding waveguide cores elements 111 and 112, and doped layers elements 102 and 104 are typically cladded with an oxide layer 130 as depicted in FIG. 1, e.g., $SiO_2$ or $Al_2O_3$. If the present LCI device 10 is a CMOS-fabricated device, then one may understand that the cladding of the oxide layer 130 need be compatible with the integration of metal interconnects for CMOS circuits.

As further seen in FIGS. 1 and 4-6, the LCI device 10 may further comprise structured silicon (Si) waveguide cores 221, 222, 223, and 224 having portions extending underneath the lateral waveguide cores elements 111 and 112, for optical coupling purposes, as in Si photonics circuits. For instance, assuming the LCI device 10 is configured as a hybrid LCI device, optical radiation may, in operation, be out-coupled from the active region 105, via the lateral waveguide cores elements 111 and 112, so as to couple into the Si waveguide cores 221-224 underneath.

The lateral waveguide cores elements 111 and 112 may be preferably tapered, so as to thin down outwardly. The portions of the structured Si waveguide cores 221, 222 may be reversely tapered, as best seen in FIG. 6, so as to favor optical coupling to/from the stack from/to the Si waveguide cores, in operation.

Figure 6:
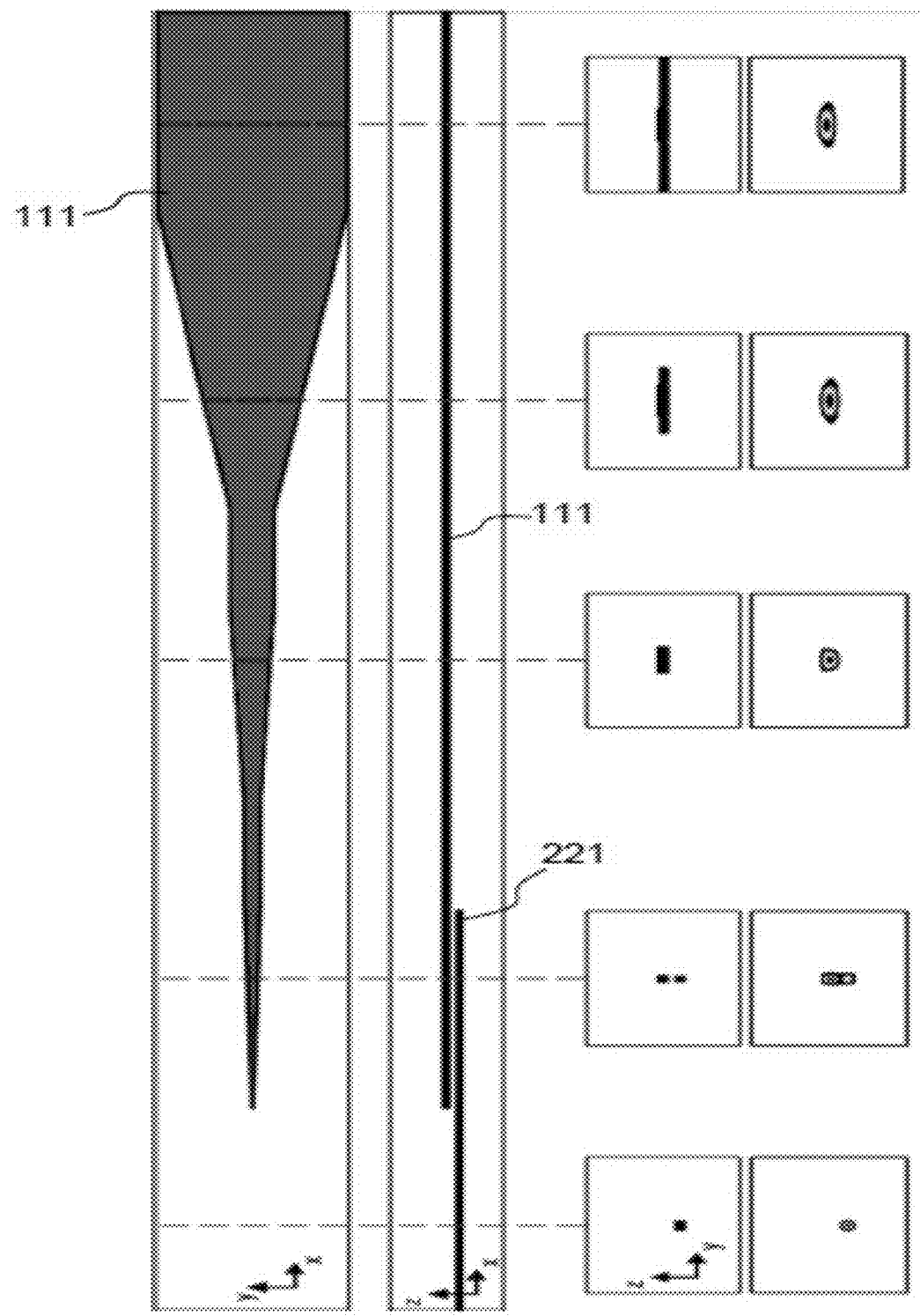
FIG. 6 depicts top and side views of a lateral waveguide core with a three-stage taper for optical coupling with a silicon waveguide core underneath, in accordance with embodiments of the present disclosure.

As further seen in FIG. 6, the lateral waveguide core element 111 may exhibit a three-stage taper profile (as seen from the top), i.e., a profile having three different successive slopes. In all cases, the structure may allow radiation to be optically coupled between the stack (via the lateral waveguide core element 111) and the Si waveguide core 221 underneath the lateral waveguide core element 111. This may be illustrated by finite difference time domain simulations in FIG. 6, where density plots of a horizontal component ($E_y$) of the electric field (in absolute value) may be depicted, for the coupling of a Transverse electric (TE) polarized optical mode. The density plots may be superimposed to a schematic depiction of the upper, tapered waveguide core element 111 and the lower Si waveguide core 221, in different cutting planes.

It is noted that depending on the application sought, the optical coupling may be bidirectional (reciprocal), e.g., occur from the stack to the Si waveguide 221, 222 or, conversely, from the Si waveguide 221, 222 to the stack, in operation of the LCI device 10.

The optical coupling may be ideally adiabatic. That is, the Si waveguide cores 221, 222 may be preferably configured so as to enable adiabatic coupling with the active region 105, whence the reverse tapers, as visible in FIG. 6. Adiabatic conditions may be met when the optical distribution is defined by the same eigen-mode, e.g., supermode of the coupled system throughout the contact, with minimal scattering to other supermodes or radiation modes. Adiabaticity, however, may be a relative term, as known; a coupler may be considered to be adiabatic when the optical loss may be below a predefined level, e.g., less than 15%, but typically less than 10%. Tapered portions of the lateral waveguide cores elements 111 and 112 may in all cases be designed to optimize the optical coupling. The length of the taper portions shall for instance typically be between 10 μm and 10 mm, which may have lengths that allow for exceeding adiabatic limits.

The present devices may be preferably embodied as lateral current injection laser devices (e.g., LCI device 10). In embodiments, such devices may be embodied as edge-emitting laser devices and, in particular, as single mode laser devices. To that aim, lateral waveguide cores elements 111 and 112 may be n-doped InP waveguides that are relied on, which may be tapered so as to filter out high-order modes.

More generally though, such devices may be configured as an optical detector or a semiconductor optical amplifier (SOA). Thus, in general, the III-V stack may be designed so as to be capable of producing, detecting, or amplifying radiation in a given range of wavelengths and, in particular, at a given, average radiation wavelength.

The wavelength range of interest may be in the optical range i.e., 100 nm-1 mm, according to DIN 5031. Thus, the terminology "radiation" as used herein refers to electromagnetic radiation in the wavelength range between 100 nm and 1 mm. However, the wavelength range may, in most applications as contemplated herein, be between 200 nm and 7.5 μm. In particular, wavelengths of 1.3 and 1.55 μm are typically contemplated (and possibly 980 nm), for datacom and telecom applications.

Figure 4:
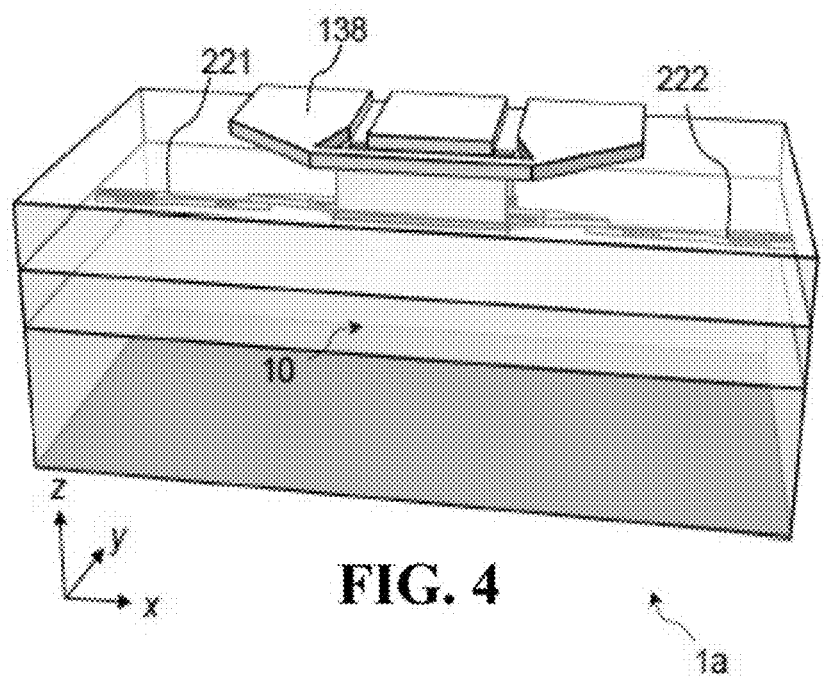
FIG. 4 depicts a 3D view (partial) of a silicon photonics chip comprising a lateral current injection laser device with radiofrequency metal contact pads on top, in accordance with embodiments of the present disclosure.
Figure 5:
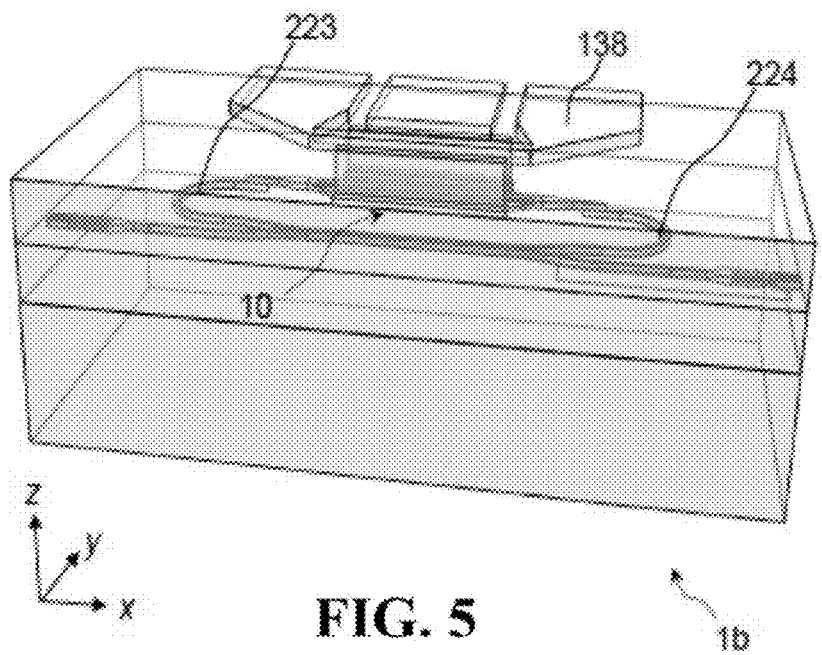
FIG. 5 depicts a 3D view (partial) of a variant to FIG. 4, where a laser device may be configured as a ring cavity, in accordance with embodiments of the present disclosure.

As further seen in FIGS. 1, 4 and 5, the Si waveguides 221-224 may further comprise Bragg mirrors 221m configured to provide a radiation feedback for the laser. Such Bragg mirrors may preferably be defined by periodic etches of the Si material that forms the Si waveguides 221-224. Similarly, grating couplers 221c may be formed directly in the Si material that forms the Si waveguides 221-224 (see FIGS. 1, 4, and 5). As depicted in FIG. 4, the device may be embodied as a Distributed Bragg Reflector laser. In variants as depicted in FIG. 5, a Si resonator may be designed as a racetrack resonator. In other variants, the Si resonator can be designed as a distributed feedback resonator, with the Si waveguide cores 221, 222 extending below the III-V stack (not shown).

The stack of III-V semiconductor gain materials may for instance comprise such compounds as $In_{1-x-y}Al_xGa_yAs$, $In_{1-x}Ga_xAs_yP_{1-y}$, and $In_{1-x}Ga_xAs_yN_{1-y}$, with $0 \leq x \leq 1$ and $0 \leq y \leq 1-x$. For example, the stack may include InAs quantum dots or InAlGaAs quantum wells. The III-V stack may notably be configured as a multiple quantum well (MQW) section, sandwiched between other III-V materials, e.g., InP, or GaAs. Meanwhile, each of the n-doped layer element 102 and the p-doped layer element 104 may comprise InP, InAs or GaAs, as further discussed in sect. 2.

Referring now to FIGS. 3-5 and 7, another aspect of the disclosure may be described which concerns a Si photonic chip 1, 1a, 1b, and 1c. In embodiments, the chips 1, 1a-1c may comprise a LCI device 10 such as described earlier. Conversely, such LCI device(s) 10 can be regarded as forming part (or intended to form part) of the Si photonics chip 1 and/or 1a-1c. The Si photonics chip 1, 1a-1c as intended herein further include structured Si waveguide cores 221-224, as already evoked earlier. That is, the Si waveguide cores have portions extending underneath the lateral waveguide cores elements 111 and 112 of the LCI device 10, for optical coupling purposes. In embodiments, the elements 102, 104, 111, and 112 may be the same elements.

In addition, the LCI device 10 may be configured as a hybrid lateral current injection device. That is, optical radiation out-coupled from the active region 105 via the lateral waveguide cores elements 111 and 112 couples into the structured Si waveguide cores 221-224, in operation. Thus, the Si waveguide cores 221-224 may be used as an optical medium, as in Si photonics devices.

The present Si photonic chips 1, 1a-1c preferably comprise a silicon 200 on insulator (SOI) wafer component 20, whose top Si layer may be structured so as to form said structured Si waveguide cores 221-224. Additional Si components may possibly be present (e.g., a heater, not shown), which may be structured from that same top Si layer. Also, the Si waveguide cores 221-224 may further be structured so as to comprise Distributed Bragg reflectors (DBRs) or other optical structures, e.g., grating couplers, as necessary for the desired couplings, as evoked earlier.

In general, all variants discussed earlier in reference to the LCI device 10 may apply to electro-optical devices included in the present Si photonics chips 1, 1a-1c. For example, each of the doped layers elements 102 and 104 of the chips 1, 1a-1c may comprise a recess 102r and 104r extending laterally along the slab and parallel to its length L, so as for the active region 105 and the contiguous pair of doped layers elements 102 and 104 to have a rib waveguide configuration. In addition, metal contacts 131 may be patterned on the top surface of the doped layers elements 102 and 104, on the same side as and along the recesses, as discussed earlier.

Preferably, the Si photonic chips 1, 1a-1c may be CMOS-fabricated devices, which may therefore include CMOS-compatible metal contacts 131, vias 132, and metal pads 137. The cladding of the oxide layer 130 may, in that case, be compatible with the integration of metal interconnects for CMOS circuits.

Figure 7:
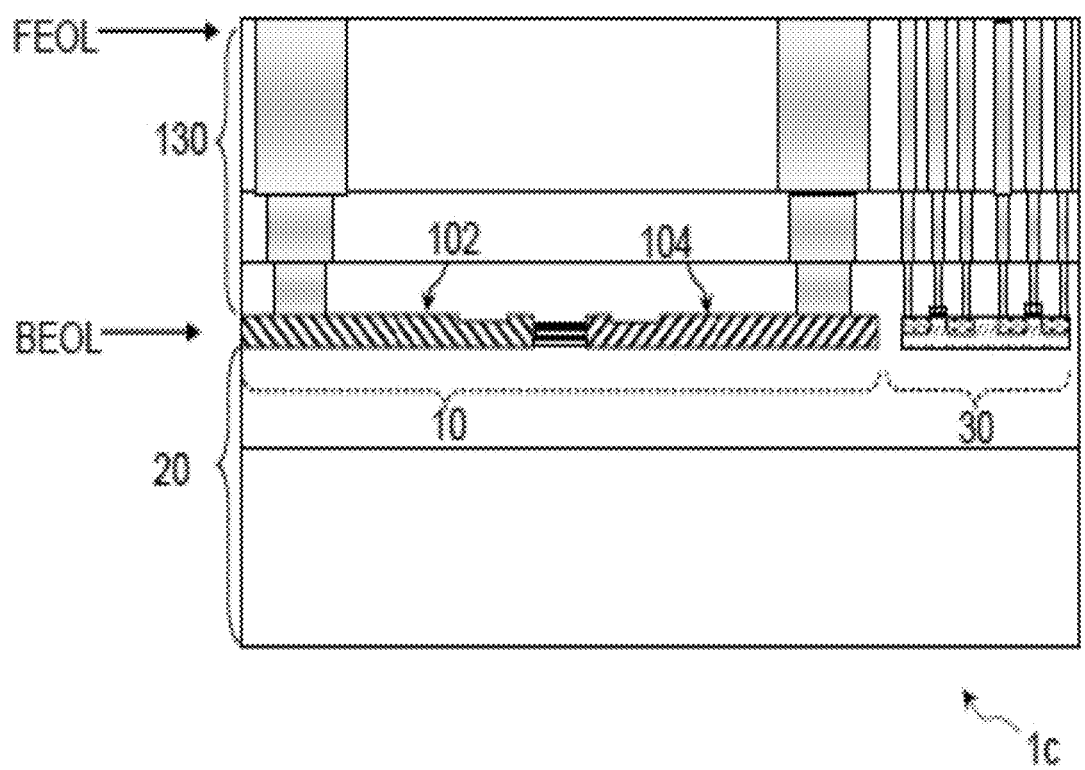
FIG. 7 depicts a 2D cross-sectional view of a silicon photonics chip, showing an electro-optical element co-integrated with other circuit elements, in accordance with embodiments of the present disclosure.

In embodiments such as depicted in FIG. 7, the Si photonic chip 1c may include the LCI device 10 that is CMOS-compatible and which may be embedded in the BEOL of the Si photonic chip 1c. Several electro-optical devices could be present. The electro-optical device 10 may possibly be co-integrated, in the BEOL of the chip 1c, with one or more CMOS-fabricated integrated circuits 30. For instance, the circuits 30 may include transistors configured for driving the electro-optical device(s) 10, as assumed in FIG. 7, where all appropriate contacts for all circuit components may be provided in the upper stack of the oxide layer 130. Additional detail may be given in sect. 2.

At present, and according to a final aspect, the disclosure can be embodied as a method of fabrication of the LCI device 10, e.g., as part of a method of fabrication of a Si photonic chips 1, 1a-1c. First, this method relies on forming an active region 105 of the LCI device 10. This region may comprise a stack of III-V semiconductor gain materials and may be formed as a slab having several lateral surface portions LS, as described before. Second, this method may involve selectively re-growing two paired elements 102, 104; 111, 112. The two pairs may include doped layers elements 102 and 104 and a pair of lateral waveguide cores elements 111 and 112, as discussed earlier. That is, the two paired elements 102, 104; 111, 112 may be laterally arranged, two-by-two, on opposite sides of the slab. These elements may distinctly adjoin respective lateral surface portions LS of the slab and thus may be separated from each other by the slab. The selective regrowth may allow a neat separation between the various elements 102, 104; 111, 112, which in turn may prevent unwanted shorts and leakage paths, as noted earlier.

The difference in terms of dopant concentration between, on the one hand, a seed layer 108 (un-doped or unintentionally doped) and, on the other hand, a layer on elements 112 and 114 (intentionally doped) as eventually obtained indicates that the p-doped layer element 114 and the n-doped layer element 112 were obtained by selective regrowth, a posteriori. In addition, certain designs as discussed herein may be impossible to obtain without selective regrowth of the InP layers around the active region.

In addition, the method(s) described herein may involve usual processing steps such as chemical mechanical polishing (CMP), bonding, wet etching, etc. One particularly advantageous fabrication method may be later described in section 2.3.

The above embodiments have been succinctly described in reference to the accompanying drawings and may accommodate a number of variants. Several combinations of the above features may be contemplated. Examples may be given in the next section.

2. Specific Embodiments/Technical Implementation Details
2.1 Specific Examples of Electro-Optical Devices In the particular example of FIG. 3, the seed layer 105b may be a residual portion of a seed layer as initially used to grow the stack, here assumed to be a multiple quantum well (MQW) stack. The seed layer 108 may be the cap layer of the initial deposition (e.g., by MOCVD), which may be upside down after bonding and can then act as a seed layer for the contact layers elements 102 and 104. The seed layers 105b, 108 may be made of InP or another III-V compound material. The contact layers elements 102 and 104 may be lateral and extend parallel to the plane (x, y). The contact layers elements 102 and 104 may be assumed to consist of doped InP in the example of FIG. 3. Typically, additional III-V layers are present, on the top and bottom of the MQW stack, including separate confinement heterostructure (SCH) layers 105a, typically comprising InAlGaAs. That is, the active region of the stack may be sandwiched between SCH layers 105a. The layers 105a, 105b may in fact be considered to form part of the active region 105.

A bonding layer 107 may extend at the interface between the two structured wafer components (e.g., formed, on the one hand, by a cladded SOI wafer version of the component 20 and, on the other hand, by a cladded version of the LCI device 10). The bonding layer 107 may in fact result from two separately deposited layers. For completeness, the upper components may be the elements 105, 102, 104, 131, 132 cladded with, e.g., the oxide layer 130, which may comprise $SiO_2$ or $Al_2O_3$, just like layers 201, 230.

In FIG. 3, symmetric sets of ohmic contacts (metal-semiconductor contacts) may be formed by metal contacts 131, which may themselves be joined by vertical metal vias 132 and top metal pads 137. The top metal pads 137 may be assumed to be radiofrequency (RF) electrodes in FIGS. 4 and 5, as depicted as RF metal pads 138. Note, however, that such RF pads 138 may not necessarily be present. They may be, in particular, not needed in case of full integration with transistors. In all cases, the contacts may be arranged so as to enable lateral current injection in the stack. The ohmic contacts may comprise n- and p-type contacts, respectively in contact with the n-doped layer element 102 and the p-doped layer element 104.

The Si photonic chip 1c of FIG. 7 may similarly involve metal contacts extending in the upper region of the oxide layer 130, so as to contact both the LCI device 10 and the neighboring circuit component 30.

Referring back to the LIC device 10 of FIG. 3, the cladding layers 201, 230, and the oxide layer 130 typically comprises a same material, e.g., $SiO_2$, Sapphire (i.e., crystalline $Al_2O_3$) or amorphous $Al_2O_3$. Preferably yet, the cladding layers may comprise $SiO_2$. Next, the III-V stack may comprise $In_{1-x-y}Al_xGa_yAs$ ($0 \leq x \leq 1$, $0 \leq y \leq 1-x$), as mentioned earlier. That is, a range of materials can thus be contemplated, including InAs, AlAs, InGaAs (e.g., for quantum dots lasers) and InAlGaAs. In particular, InAs quantum dots can be contemplated when using a GaAs substrate. In variants, the III-V stack may comprise InGaAsP or InGaAsN. In general, the III-V stack may be configured as a MQW section sandwiched between other III-V materials, e.g. InP, or GaAs, preferably lattice matched to the MQW section to prevent oxidation, as needed to start the growth of the core III-V stacked layers. The III-V stack may also comprise quantum dots sandwiched between quantum wells.

Such a layer stack may be grown, e.g., by molecular beam epitaxy (MBE) or by metal-organic chemical vapor deposition (MOCVD). The semiconductor materials can be doped, as necessary, and preferably in conjunction with strain, e.g., to tune the bandgap.

2.2 Preferred Embodiments of Electro-Optical Devices

In embodiments, the present electro-optical device(s) 10 may be embodied as a III-V on silicon photonics laser device, dimensioned so as to allow a low threshold current. Patterning techniques as described in section 2.3 may allow a very small device (e.g., on a micrometer-scale) to be achieved, so as to enable high-speed operation and large scale integration.

The Si waveguide cores may be optically coupled to the III-V optical gain medium, which may be laterally sandwiched between an electron medium and a hole injection medium. InGaAlAs quantum wells or dots may be preferentially used, due to their thermal stability.

A III-V thin slab may be bonded to the SOI wafer using a thin layer (e.g., in the expression of micrometers) of aluminum oxide. The III-V slab may be patterned as a rib waveguide. Recesses 102r, 104r delimiting the waveguide may be defined on the top surface of the lateral contact layers (InP) of elements 102 and 104.

The core of the rib waveguide may contain the active region 105. The n- and p-regions may be separated by the active region and may be on both sides of the active region 105, which feature may be enabled by selective regrowth of InP of elements 102 and 104 around the active region 105.

The active region 105 may extend slightly beyond the n- and p-regions of elements 102 and 104 and may be further butt-coupled at each extremity to an n-doped InP waveguide elements 111 and 112. The lateral waveguide elements 111 and 112 may be tapered so as filter out high-order modes.

The tips of the lateral waveguides may be located right above the small (reversely tapered) tips that terminate silicon strip waveguides, e.g., the tips in the III-V lateral waveguides and in the silicon layer that may have similar geometries, though there may be reversed.

The silicon waveguides may contain Bragg mirrors (e.g., 221m, 222m) that may be defined by a periodic etch of the silicon material, so as to provide feedback to the laser.

Metal contacts 131 (e.g., electrodes) may be patterned on outer sides of the recesses formed on top of the contact layers of elements 102 and 104. The whole structure may be embedded in a cladding of oxide layer 130 delimiting the back-end of the line of the Si photonic chips 1, 1a-1c. Metal vias 132 may enable access to the laser contacts from the RF top pads 137 (e.g., electrodes).

The selective regrowth of the lateral elements 102, 104; 111, 112 may allow a clean separation. In addition, this may make it possible to improve the ohmic contacts and obtain high doping levels. Moreover, 2D monolithic integration can be contemplated in the back-end of the line of a CMOS chip.

2.3 Preferred Fabrication Process

A preferred fabrication process may now be described. First, a SOI wafer may be provided. Second, the top Si layer of the SOI wafer may be structured using electron beam lithography (EBL), or deep UV lithography for mass production in a foundry, to shape a resist on top of the top Si layer, followed by inductively coupled plasma (ICP), or reactive ion etch etching (RIE). Tapered Si waveguide cores can accordingly be obtained. Third, after having removed the residual resist portion, plasma-enhanced chemical vapor deposition (PECVD) may be used to clad (with silica) the tapered Si waveguide cores. The deposited cladding layer may be subsequently polished by CMP.

Fourth, a III-V wafer may then be bonded onto the processed SOI wafer. Fifth, the III-V substrate may be removed by wet etching of the sacrificial layer grown on the III-V substrate before the active region. Sixth, ICP etching may be used to obtain the multiple quantum well (MQW) section sandwiched between other III-V materials, e.g. InP. Seventh, the lateral waveguide cores and the contact (n- and p-doped) layers may be selectively regrown by metal-organic chemical vapor deposition (MOCVD), so as to obtain a clean separation, without shorts.

Seventh, the InP regions may be structured by ICP etching, as needed to obtain the desired profiles. Eighth, another PECVD step may be performed to clad (with silica) the structured InP layers (including the tapered out-coupling waveguide cores). Vias may be opened in the cladding layer by RIE and wet etch. Metal contacts may be deposited and patterned by a lift-off process (or RIE). Finally, RF electrodes may be patterned on top of the underlying contacts, using again a lift-off process.

While the present disclosure may have been described with reference to a limited number of embodiments, variants and the accompanying drawings, it will be understood by those skilled in the art that various changes may be made and equivalents may be substituted without departing from the scope of the present disclosure. In particular, a feature (device-like or method-like) recited in a given embodiment, variant or shown in a drawing may be combined with or replace another feature in another embodiment, variant or drawing, without departing from the scope of the present disclosure. Various combinations of the features described in respect of any of the above embodiments or variants may accordingly be contemplated, that remain within the scope of the appended claims. In addition, many minor modifications may be made to adapt a particular situation or material to the teachings of the present disclosure without departing from its scope. Therefore, it may be intended that the present disclosure not be limited to the particular embodiments disclosed, but that the present disclosure will include all embodiments falling within the scope of the appended claims. In addition, many other variants than explicitly touched above can be contemplated. For examples, other materials than those explicitly cited may be contemplated.

What is claimed is:

1. A lateral current injection electro-optical device comprising:
    an active region comprising a stack of III-V semiconductor gain materials stacked along a stacking direction z, the active region formed as a slab having two pairs of opposite, lateral surface portions, each extending parallel to said stacking direction z, wherein the slab is a form factor, whereby a length of the slab is larger than a width thereof, wherein said width, said length, and said stacking direction z are perpendicular; and two paired elements, including:

a pair of doped layers of III-V semiconductor materials, including an n-doped layer and a p-doped layer, wherein the p-doped layer and the n-doped layer are arranged on respective sides of the slab, contiguously with the opposite, lateral surface portions of one of said two pairs of lateral surface portions, wherein a maximum length of each of the p-doped layer and the n-doped layer is less than a length of said opposite, lateral surface portions of said one of said two pairs, and wherein each of the p-doped layer and the n-doped layer comprises, on a top surface portion thereof, a recess extending laterally along the slab and parallel to its length, so as for the active region and the contiguous pair of doped layers to have a rib waveguide configuration; and a pair of lateral waveguide cores, wherein the lateral waveguide cores are laterally butt-jointed to the opposite, lateral surface portions of the other one of said two pairs of surface portions, and wherein the two paired elements are laterally arranged on opposite sides of the slab, the elements distinctly adjoining respective elements of the lateral surface portions of the slab such that the elements are separated from each other by the slab.

2. The lateral current injection electro-optical device according to claim 1, further comprising:

a metal contact patterned on a top surface portion of each of the p-doped layer and the n-doped layer, along the recess.

3. The lateral current injection electro-optical device according to claim 1, wherein:

the electro-optical device further comprises structured silicon waveguide cores having portions extending underneath said lateral waveguide cores; and the electro-optical device is configured as a hybrid lateral current injection device, whereby optical radiation out-coupled from the active region via the lateral waveguide cores couples into the structured silicon waveguide cores, in operation.

4. The lateral current injection electro-optical device according to claim 3, wherein:

the lateral waveguide cores are tapered, so as to thin down outwardly, and said portions of the structured silicon waveguide cores are reversely tapered.

5. The lateral current injection electro-optical device according to claim 4, wherein:

the lateral waveguide cores exhibit, each, a three-stage taper.

6. The lateral current injection electro-optical device according to claim 1, wherein:

each of the p-doped layer and the n-doped layer are tapered, so as to laterally flare towards the slab, at a level of contact therewith.

7. The lateral current injection electro-optical device according to claim 1, wherein:

the electro-optical device is a lateral current injection laser device.

8. The lateral current injection electro-optical device according to claim 7, wherein:

the laser device is a single mode laser device.

9. The lateral current injection electro-optical device according to claim 7, wherein:

the silicon waveguides comprise Bragg mirrors configured so as to provide a radiation feedback for the laser.

10. The lateral current injection electro-optical device according to claim 1, wherein:

said stack of III-V semiconductor gain materials comprise one of: $In_{1-x-y}Al_xGa_yAs$; $In_{1-x}Ga_xAs_yP_{1-y}$; and $In_{1-x}Ga_{x-}As_yN_{1-y}$, with $0 \le x \le 1$ and $0 \le y \le 1-x$; and each of the p-doped layer and the n-doped layer comprises one of InP, InAs or GaAs.

11. The lateral current injection electro-optical device according to claim 1, wherein:

each of the lateral waveguide cores, the p-doped layer, and the n-doped layer are a selectively regrown layer.

12. A silicon photonic chip, wherein the silicon photonic chip is a CMOS-fabricated device, comprising:

a lateral current injection, electro-optical device comprising an active region that is comprised of a stack of III-V semiconductor gain materials stacked along a stacking direction z and two paired elements, wherein the active region is formed as a slab having several lateral surface portions, each extending parallel to said stacking direction z, and the two paired elements include:

a pair of doped layers of III-V semiconductor materials that include an n-doped layer and a p-doped layer, wherein each of the p-doped layer and the n-doped layer comprises a recess extending laterally along the slab and parallel to its length, so as for the active region and the contiguous pair of doped layers to have a rib waveguide configuration, and a pair of lateral waveguide cores, wherein the two paired elements are laterally arranged on opposite sides of the slab, the elements distinctly adjoining respective elements of the lateral surface portions of the slab, so as for these elements to be separated from each other by the slab;

structured silicon waveguide cores having portions extending underneath the pair of lateral waveguide cores of the electro-optical device, wherein the electro-optical device is configured as a hybrid lateral current injection device, whereby optical radiation out-coupled from the active region via the lateral waveguide cores couples into the structured silicon waveguide cores, in operation; and a silicon on insulator wafer, whose top silicon layer is structured so as to form said structured silicon waveguide cores.

13. The silicon photonic chip according to claim 12, further comprising:

a CMOS-compatible metal contact patterned on a top surface portion of each of the p-doped layer and the n-doped layer, the top surface portion being on a same side as and along the recess extending on said each of the doped layer.

* * * * *